(12) United States Patent
Arora (10) Patent No.: US 6,881,445 B1
(45) Date of Patent: Apr. 19, 2005

(54) FORMING THIN FILMS ON SUBSTRATES USING A POROUS CARRIER

(75) Inventor: Pramod K. Arora, North Royalton, OH (US)

(73) Assignee: Innovation Chemical Technologies, Ltd., North Royalton, OH (US)

(*) Notice: Subject to any disclaimer, the term of this patent is extended or adjusted under 35 U.S.C. 154(b) by 171 days.

(21) Appl. No.: 10/082,712

(22) Filed: Feb. 25, 2002

Related U.S. Application Data (60) Provisional application No. 60/350,096, filed on Oct. 29, 2001.

(51) Int. Cl.[7] .............................................. C23C 16/00
(52) U.S. Cl. .............................. 427/248.1; 427/255.6; 427/255.7
(58) Field of Search .......................... 427/255.6, 248.1, 427/255.7

(56) References Cited

U.S. PATENT DOCUMENTS

| | | | |
|---|---|---|---|
| 4,193,942 A | 3/1980 | Gerritsen et al. | 260/604 |
| 5,078,791 A | 1/1992 | Singh et al. | 106/287 |
| 5,081,192 A | 1/1992 | Tatemoto | 525/288 |
| 5,084,302 A | 1/1992 | Inoue et al. | 427/164 |
| 5,096,814 A | 3/1992 | Aivasidis et al. | 435/41 |
| 5,106,561 A | 4/1992 | Singh et al. | 264/165 |
| 5,165,955 A * | 11/1992 | Gentle | 427/575 |
| 5,166,000 A | 11/1992 | Singh et al. | 428/428 |
| 5,372,851 A | 12/1994 | Ogawa et al. | 427/255.7 |
| 5,645,939 A | 7/1997 | Yoneda et al. | 428/429 |
| 5,766,698 A | 6/1998 | Singh et al. | 427/601 |
| 5,853,800 A * | 12/1998 | Dombrowski et al. | 427/162 |
| 5,897,918 A | 4/1999 | Singh et al. | 427/352 |
| 6,057,042 A | 5/2000 | Shimotsu | 428/451 |
| 6,143,358 A | 11/2000 | Singh et al. | 427/162 |
| 6,166,855 A | 12/2000 | Ikeyama et al. | 359/580 |
| 6,171,652 B1 | 1/2001 | Singh et al. | 427/255.6 |
| 6,183,872 B1 | 2/2001 | Tanaka et al. | 428/429 |
| 6,264,751 B1 * | 7/2001 | Kamura et al. | 118/725 |
| 6,284,908 B1 | 9/2001 | Loy et al. | 556/467 |
| 6,340,734 B1 | 1/2002 | Lin et al. | 528/15 |
| 6,440,550 B1 * | 8/2002 | Hacker | 428/312.6 |
| 2002/0082329 A1 * | 6/2002 | Arora et al. | 524/430 |

FOREIGN PATENT DOCUMENTS

| | | |
|---|---|---|
| EP | 0 659 904 A2 | 6/1995 |
| EP | 0 842 711 A1 | 5/1998 |

OTHER PUBLICATIONS

Hoffmann, Patrick W., et al., "Vapor Phase Self–Assembly of Fluorinated Monolayers on Silicon and Germanium Oxide," Langmuir 1997, 13, 1877–1880.

Brzoska, J.B., et al. "Silanization of Solid Substrates: A Step Toward Reproducibility," Langmuir 1994, 10, 4367–4373.

Jansen, F. and Krommenhoek, S., "Thin Film Deposition on Inside Surfaces by Plasma Enhanced Chemical Vapor Deposition," Thin Solid Films 252 (1994) 32–37.

Parikh, A.N., et al., "n–Alkylsiloxanes: From Single Monolayers to Layered Crystals. The Formation of Crystalline Polymers from the Hydrolysis of n–Octadecyltrichlorosilane," J. Am. Chem. Soc. 1997, 119, 3135–3143.

Baney, R., et al. "Silsesquioxanes," Chem. Rev. 1995, 95, 1409–1430.

Moore, J.A. et al, "Chemical Vapor Deposition of Fluorinated Polymers," Polymer Preprint, 1993, 34, p. 427–428.

(Continued)

*Primary Examiner*—Timothy Meeks
(74) *Attorney, Agent, or Firm*—Amin & Turocy, LLP (57) ABSTRACT

The invention relates to a composite containing a porous carrier and an amphiphilic material. The composite may be employed in methods and systems for forming thin films on substrates.

23 Claims, 1 Drawing Sheet

OTHER PUBLICATIONS

Nason, T.C. et al. "Deposition of Amorphous Fluoropolymer Thin Films by Thermolysis of Teflon Amorphous Fluoropolymer," App. Phys. Lett. 60, (15) Apr. 13, 1992.

Feher, F. and Newman, D., "Enhanced Silylation Reactivity of a Model for Silica Surfaces," J. Am. Chem. Soc. 1990, 112, 1931–1936.

Shea, K.J., et al., "Arylsilsesquioxane Gels and Related Materials. New Hybrids or Organic and Inorganic Networks," J. Am. Chem. Soc. 1992, 114, 6700–6710.

Elsevier, Ruth A., "Vacuum Technology," 1990 311–319.

International Search Report dated Dec. 30, 2002 in PCT Patent Application No. PCT/US02/34033 filed Oct. 24, 2002.

European Search Report, EP 02 78 0524, Nov. 23, 2004.

* cited by examiner

FORMING THIN FILMS ON SUBSTRATES USING A POROUS CARRIER

RELATED APPLICATIONS

This application claims priority to provisional application Ser. No. 60/350,096 filed Oct. 29, 2001, the contents of which are incorporated herein.

FIELD OF THE INVENTION

The present invention generally relates to thin films. In particular, the present invention relates to forming a high quality thin film on substrate using a porous carrier.

BACKGROUND OF THE INVENTION

Polymerizable amphiphilic molecules and hydrolysable alkyl silanes are employed to form thin films on various surfaces. Thin films have numerous and diverse useful purposes. For example, a thin film may be formed on a lens for scratch resistance or on a metal for corrosion protection.

It is difficult to form a thin film of amphiphilic molecules directly on a lens, so a silicon dioxide layer is initially formed on the lens in an anhydrous environment in a first chamber. The silica coated lens is then transferred to a second chamber for deposition of the film of amphiphilic molecules. During the transfer, the silica coated lens is exposed to water vapor in the air which hydrolyzes the surface and permits subsequent strong adhesion between the amphiphilic molecules and the lens. Forming the amphiphilic thin film in the same chamber as the silica layer leads to corrosion of the interior of the chamber, the contamination of the chamber preventing repeated use of the chamber for the two step process without thorough cleaning, and the undesirable formation of a messy, difficult to clean film on the interior of the chamber. Nevertheless, in some instances, the requirement of two chambers can be cumbersome.

When forming a thin film on a substrate, a film forming material is typically dissolved in a solvent. The solvent/film forming material mixture is then contacted with the substrate. One problem with forming a thin film in this manner is that the solvent is typically toxic, and may be hazardous due to flammability. In other words, the use of solvents that can dissolve film forming materials may undesirably raise serious health and environmental concerns. Disposal of the solvents is a serious environmental concern particularly in the case of oil base and halocarbon solvents.

Furthermore, the use of such solvents leads to the generation of hydrogen chloride gas as a by-product, which creates additional serious health hazards, unless a neutralizer trap is used and properly disposed according to EPA and OSHA regulations. Proper use and disposal is very difficult in a working environment, especially since an operator must track such use. Hence, each operator and lab may require having toxic gas monitors or employ the use of vapor masks, which are uncomfortable to operator.

One recent development in the field of thin film formation is the use of an ampuole to deliver a film forming material to a substrate. Using a vapor phase coating process, an ampuole containing a film forming material is placed in a vacuum chamber with the substrate. After a vacuum is established, the ampuole breaks releasing the film forming material which vaporizes and proceeds to form a film on the substrate. The ampuole is an easy to handle, convenient vehicle to charge the chamber with a film forming material. However, there are several concerns when using an ampuole in this manner.

First, when the ampuole breaks releasing the film forming material, broken glass may damage the substrate. Due to pressure differences between the inside of the ampuole and the vacuum chamber, the ampuole breaks with undesirably high force, projecting glass pieces throughout the chamber. A related problem is that the film forming material then undesirably forms a film over the broken glass pieces in addition to the substrate, thereby lowering the amount of film forming material destined for the substrate.

Second, when the ampuole breaks with high force, the film forming material tends to spurt out, leading to a non-uniform film on the substrate. The inability to control the release of the film forming material raises the need to inspection and often cleaning of coated substrates.

SUMMARY OF THE INVENTION

One aspect of the invention relates to a composite containing a porous carrier and an amphiphilic material. The amphiphilic material is useful for forming thin films on substrates. The composite may thus be employed in methods and systems for forming thin films on substrates. Since the porous carrier is used to deliver the amphiphilic material to the chamber, damage to substrates is mitigated while uniform distribution of amphiphilic material vapor is facilitated. Moreover, the porous carrier mitigates splashing as the amphiphilic material is vaporized. Less splashing leads to less waste.

As a result, the thin film formed on the substrate using the composite of a porous carrier impregnated with the amphiphilic molecules is continuous in nature. Pinholes and other film defects commonly observed in conventionally made thin films are minimized and/or eliminated.

Another aspect of the invention relates to a composite containing a porous carrier and a polyhedral oligomeric silsesquioxane amphiphilic material. When using the polyhedral oligomeric silsesquioxane amphiphilic material, it is unnecessary to expose the substrate to water vapor in the event a silica (or other metal oxide type coating) coating is employed to improve adhesion. As a result, the formation of silica and the amphiphilic thin film can be conducted in one chamber, simplifying the coating process.

DETAILED DESCRIPTION OF THE INVENTION

Using a composite containing a porous carrier and amphiphlic material, uniform and continuous thin films can be efficiently formed on substrates without damaging the substrates. The porous carrier, akin to a metal sponge in certain instances, constitutes an advantageous vehicle for facilitating the vapor deposition of a thin film made of an amphiphlic material.

Amphiphilic molecules have the intrisic ability to self assemble and/or self-polymerize in a thin film. Amphiphilic molecules typically have head and tail groups (tail being a nonreactive, non-polar group and head being reactive, polar group). Amphiphilic molecules generally include polymerizable amphiphilic molecules, hydrolyzable alkyl silanes, hydrolyzable perhaloalkyl silanes, chlorosilanes, polysiloxanes, alkyl silazanes, perfluoroalkyl silazanes, disilazanes, and silsesquioxanes.

The polar group or moiety of the amphiphile can be a carboxylic acid, alcohol, thiol, primary, secondary and tertiary amine, cyanide, silane derivative, phosphonate, and sulfonate and the like. The non-polar group or moiety mainly includes alkyl groups, per fluorinated alkyl groups, alkyl ether groups, and perfluorinated alkyl ether groups. These non-polar groups may include diacetylene, vinylunsaturated or fused linear or branched aromatic rings.

In one embodiment, the amphiphilic molecule is represented by Formula I:

$$R_mSiZ_n \quad (I)$$

where each R is individually an alkyl, fluorinated alkyl, alkyl ether or fluorinated alkyl ether containing from about 1 to about 30 carbon atoms, substituted silane, or siloxane; each Z is individually one of halogens, hydroxy, alkoxy and acetoxy; and m is from about 1 to about 3, n is from about 1 to about 3, and m+n equal 4. In another embodiment, R is an alkyl, fluorinated alkyl, an alkyl ether or a fluorinated alkyl ether containing from about 6 to about 20 carbon atoms. The alkyl group may contain the diacetylene, vinyl-unsaturated, single aromatic and fused linear or branched aromatic rings.

In another embodiment, the amphiphilic molecule is represented by Formula II:

$$R_mSH_n \quad (II)$$

where R is an alkyl, fluorinated alkyl, an alkyl ether or a fluorinated alkyl ether containing from about 1 to about 30 carbon atoms; S is sulfur; H is hydrogen; m is from about 1 to about 2 and n is from 0 to 1. In another embodiment, R is an alkyl, fluorinated alkyl, an alkyl ether or a fluorinated alkyl ether containing from about 6 to about 20 carbon atoms. The alkyl chain may contain diacetylene, vinyl, single aromatics, or fused linear or branched aromatic moieties.

In yet another embodiment, the amphiphilic molecule is represented by RY, where R is an alkyl, fluorinated alkyl, an alkyl ether or a fluorinated alkyl ether containing from about 1 to about 30 carbon atoms and Y is one of the following functional groups: —COOH, —SO$_3$H, —PO$_3$, —OH, and —NH$_2$. In another embodiment, R is an alkyl, fluorinated alkyl, an alkyl ether or a fluorinated alkyl ether containing from about 6 to about 20 carbon atoms. The alkyl chain may contain diacetylene, vinyl-unsaturated, single aromatic, or fused linear or branched aromatic moieties.

In still yet another embodiment, the amphiphilic molecule may include one or more of the following Formulae (III) and (IV):

$$CF_3(CF_2)_7CH_2CH_2—Si(CH_3)_2Cl \quad (III)$$

$$CF_3(CF_2)_7CH_2CH_2—Si(OEt)_3 \quad (IV)$$

In another embodiment, the amphiphilic molecule is a disilazane represented by Formula V:

$$RSiNSiR \quad (V)$$

where R is an alkyl, fluorinated alkyl, an alkyl ether or a fluorinated alkyl ether containing from about 1 to about 30 carbon atoms. In another embodiment, R is an alkyl, fluorinated alkyl, an alkyl ether or a fluorinated alkyl ether containing from about 6 to about 20 carbon atoms.

In another embodiment, the amphiphilic molecule is represented by Formula VI:

$$R(CH_2CH_2O)_qP(O)_x(OH)_y \quad (VI)$$

where R is an alkyl, fluorinated alkyl, an alkyl ether or a fluorinated alkyl ether containing from about 1 to about 30 carbon atoms, q is from about 1 to about 10, and x and y are independently from about 1 to about 4.

In still yet another embodiment, the amphiphilic molecule is formed by polymerizing a silicon containing compound, such as tetraethylorthosilicate (TEOS), tetramethoxysilane, and/or tetraethoxysilane Amphiphilic molecules (and in some instances compositions containing amphiphilic molecules) are described in U.S. Pat. Nos. 6,238,781; 6,206,191; 6,183,872; 6,171,652; 6,166,855 (overcoat layer); 5,897,918; 5,851,674; 5,822,170; 5,800,918; 5,776,603; 5,766,698; 5,759,618; 5,645,939; 5,552,476; and 5,081,192; Hoffmann et al., and "Vapor Phase Self-Assembly of Fluorinated Monlayers on Silicon and German Oxide," Langmuir, 13,1877–1880, 1997; which are hereby incorporated by reference for their teachings of amphiphilic materials.

Specific examples of amphiphilic molecules and compounds that can be hydrolyzed into amphiphilic materials include octadecyltrichlorosilane; octyltrichlorosilane; heptadecafluoro-1,1,2,2-tetrahydrodecyl trichlorosilane available from Shin Etsu under the trade designation KA-7803; hexadecyl trimethoxysilane available from Degussa under the trade designation Dynasylan 9116; tridecafluorooctyl triethoxysilane available from Degussa under the trade designation Dynasylan F 8261; methyltrimethoxysilane available from Degussa under the trade designation Dynasylan MTMS; methyltriethoxysilane available from Degussa under the trade designation Dynasylan MTES; propyltrimethoxysilane available from Degussa under the trade designation Dynasylan PTMO; propyltriethoxysilane available from Degussa under the trade designation Dynasylan PTEO; butyltrimethoxysilane available from Degussa under the trade designation Dynasylan IBTMO; butyltriethoxysilane available from Degussa under the trade designation Dynasylan BTEO; octyltriethoxysilane available from Degussa under the trade designation Dynasylan OCTEO; fluoroalkylsilane in ethanol available from Degussa under Dynasylan 8262; fluoroalkylsilane-formulation in isopropanol available from Degussa under Dynasylan F 8263; modified fluoroalkyl-siloxane available from Degussa under Dynasylan® F 8800; and a water-based modified fluoroalkyl-siloxane available from Degussa under Dynasylan F 8810. Additional examples of amphiphilic molecules and compounds that can be hydrolyzed into amphiphilic materials include fluorocarbon compounds and hydrolyzates thereof under the trade designation Optool DSX available from Daikin Industries, Ltd.; silanes under the trade designations KA-1003 (vinyltrichloro silane), KBM-1003 (vinyltrimethoxy silane), KBE-1003 (vinyltriethoxy silane), KBM-703 (chloropropyltrimethoxy silane), X-12-817H, X-71-101, X-24-7890, KP801M, KA-12 (methyldichloro silane), KA-13 (methyltrichloro silane), KA-22 (dimethyldichloro silane), KA-31 (trimethylchloro silane), KA-103 (phenyltrichloro silane), KA-202 (diphenyldichloro silane), KA-7103 (trifluoropropyl trichloro silane), KBM-13 (methyltrimethoxy silane), KBM-22 (dimethyldimethoxy silane), KBM-103 (phenyltrimethoxy silane), KBM-202SS (diphenyidimethoxy silane), KBE-13 (methyltriethoxy silane), KBE-22 (dimethyldiethoxy silane), KBE-103 (phenyltriethoxy silane), KBE-202 (diphenyldiethoxy silane), KBM-3063 (hexyltrimethoxy silane), KBE-3063 (hexyltriethoxy silane), KBM-3103 (decyltrimethoxy silane), KBM-7103 (trifluoropropyl trimethoxysilane), KBM-7803 (heptadecafluoro-1,1,2,2-tetrahydrodecyl trimethoxysilane), and KBE-7803 (heptadecafluoro-1,1,2,2-tetrahydrodecyl triethoxysilane) available from Shin Etsu.

Additional specific examples of amphlphilic materials include $C_9F_{19}C_2H_4Si(OCH_3)_3$; $(CH_3O)_3SiC_2H_4C_6F_{12}C_2H_4Si(OCH_3)_3$; $C_9F_{19}C2H_4Si(NCO)_3$; $(OCN)_3SiC_2H_4Si(NCO)_3$; $Si(NCO)_4$; $Si(OCH_3)_4$; $CH_3Si(OCH_3)_3$; $CH_3Si(NCO)_3$; $C_8H_{17}Si(NCO)_3$; $(CH_3)_2Si(NCO)_2$; $C_8F_{17}CH_2CH_2Si(NCO)_3$; $(OCN)_3SiC_2H_4C_6F_{12}C_2H_4Si(NCO)_3$; $(CH_3)_3SiO-[Si(CH_3)_2-O-]_n-Si(CH_3)_3$ (viscosity of 50 centistokes); $(CH_3O)_2(CH_3)SiC_2H_4C_6F_{12}C_2H_4Si(CH_3)(OCH_3)_2$; $C_8F_{17}CH_2CH_2Si(OCH_3)_3$; dimethylpolysiloxane having a viscosity of 50 centistokes (KF96, manufactured by Shin Etsu); modified diemthylpolysiloxane having a viscosity of 42 centistokes and having hydroxyl groups at both terminals (KF6001, manufactured by Shin Etsu); and modified dimethylpolysiloxane having a viscosity of 50 centistokes and having carboxyl groups (X-22-3710, manufactured by Shin Etsu).

In another embodiment, the amphiphilic material contains a repeating unit of a polyorganosiloxane introduced into a fluoropolymer. The fluoropolymer having the repeating unit of a polyorganosiloxane can be obtained by a polymerization reaction of a fluoromonomer and a polyorganosiloxane having a reactive group as a terminal group. The reactive group is formed by chemically binding an ethylenically unsaturated monomer (e.g., acrylic acid, an ester thereof, methacrylic acid, an ester thereof, vinyl ether, styrene, a derivative thereof) to the end of the polyorganosiloxane.

The fluoropolymer can be obtained by a polymerization reaction of an ethylenically unsaturated monomer containing fluorine atom (fluoromonomer). Examples of the fluoromonomers include fluoroolefins (e.g., fluoroethylene, vinylidene fluoride, tetrafluoroethylene, hexafluoropropylene, perfluoro-2,2-dimethyl-1,3-diol), fluoroalkyl esters of acrylic or methacrylic acid and fluorovinyl ethers. Two or more fluoromonomers can be used to form a copolymer.

A copolymer of a fluoromonomer and another monomer can also be used as the amphiphilic material. Examples of the other monomers include olefins (e.g., ethylene, propylene, isoprene, vinyl chloride, vinylidene chloride), acrylic esters (e.g., methyl acrylate, ethyl acrylate, 2-ethylhexyl acrylate), methacrylic esters (e.g., methyl methacrylate, ethyl methacrylate, butyl methacrylate, ethylene glycol dimethacrylate), styrenes (e.g., styrene, vinyltoluene, alpha.-methylstyrene), vinyl ethers (e.g., methyl vinyl ether), vinyl esters (e.g., vinyl acetate, vinyl propionate, vinyl cinnamate), acrylamides (e.g., N-tert-butylacrylamide, N-cyclohexylacrylamide), methacrylamides and acrylonitriles.

Amphiphilic molecules further include the hydrolyzation products of any of the compounds described above. In particular, treating any of the above described compounds with an acid or base yields amphiphilic materials ideally suited for forming thin film on substrates.

Amphiphilic molecules specifically include polyhedral oligomeric silsesquioxanes (POSS), and such compounds are described in U.S. Pat. Nos. 6,340,734; 6,284,908; 6,057,042; 5,691,396; 5,589,562; 5,422,223; 5,412,053; *J. Am. Chem. Soc.* 1992, 114, 6701–6710; *J. Am. Chem. Soc.* 1990, 112, 1931–1936; *Chem.Rev.* 1995, 95, 1409–1430; and *Langmuir*, 1994, 10, 4367, which are hereby incorporated by reference. The POSS oligomers/polymers contain reactive hydroxyl groups. Moreover, the POSS polymers/oligomers have a relatively rigid, thermally stable silicon-oxygen framework that contains an oxygen to silicon ratio of about 1.5. These compounds may be considered as characteristically intermediate between siloxanes and silica. The inorganic framework is in turn covered by a hydrocarbon/fluorocarbon outer layer enabling solubilization and derivatization of these systems, which impart hydrophobic/oleophobic properties to the substrate surface in a manner similar as alkyltrichlorosilanes.

In one embodiment the POSS polymer contains a compound represented by Formula (VII):

$$[R(SiO)_x(OH)_y] \qquad (VII)$$

where R is an alkyl, aromatic, fluorinated alkyl, an alkyl ether or a fluorinated alkyl ether containing from about 1 to about 30 carbon atoms; x is from about 1 to about 4; and y is from about 1 to about 4. In another embodiment, R is an alkyl, aromatic, fluorinated alkyl, an alkyl ether or a fluorinated alkyl ether containing from about 6 to about 20 carbon atoms; x is from about 1 to about 3; and y is from about 1 to about 3. Such a compound can be made by stirring $RSiX_3$, such as an alkyl trihalosilane, in water and permitting it to hydrolyze, using an acid or base (such as HCl or ammonium hydroxide, respectively) to further hydrolyze the first hydrolization product.

Examples of POSS polymers include poly(p-hydroxybenzylsilsesquioxane) (PHBS); poly(p-hydroxybenzylsilsesquioxane-co-methoxybenzylsilsesquioxane) (PHB/MBS); poly(p-hydroxybenzylsilsesquioxane-co-t-butylsilsesquioxane) (PHB/BS); poly(p-hydroxybenzylsilsesquioxane-co-cyclohexylsilsesquioxane) (PHB/CHS); poly(p-hydroxybenzylsilsesquioxane-co-phenylsilsesquioxane) (PHB/PS); poly(p-hydroxybenzylsilsesquioxane-co-bicycloheptylsilsesquioxane) (PHB/BHS); poly(p-hydroxyphenylethylsilsesquioxane) (PHPES); poly(p-hydroxyphenylethylsilsesquioxane-co-p-hydroxy-α-methylbenzyls ilsesquioxane) (PHPE/HMBS); poly(p-hydroxyphenylethylsilsesquioxane-co-methoxybenzylsilsesquioxane) (PHPE/MBS); poly(p-hydroxyphenylethylsilsesquioxane-co-t-butylsilsesquioxane) (PHPE/BS); poly(p-hydroxyphenylethylsilsesquioxane-co-cyclohexylsilsesquioxane) (PHPE/CHS); poly(p-hydroxyphenylethylsilsesquioxane-co-phenylsilsesquioxane) (PHPE/PS); poly(p-hydroxyphenylethylsilsesquioxane-co-bicycloheptylsilsesquioxane) (PHPE/BHS); poly(p-hydroxy-α-methylbenzylsilsesquioxane) (PHMBS); poly(p-hydroxy-α-methylbenzylsilsesquioxane-co-p-hydroxybenzylsilsesquioxane) (PHMB/HBS); poly(p-hydroxy-α-methylbenzylsilsesquioxane-co-methoxybenzylsilsesquioxane) (PHMB/HBS); poly(p-hydroxy-α-methylbenzylsilsesquioxane-co-t-butylsilsesquioxane) (PHMB/BS); poly(p-hydroxy-α-methylbenzylsilsesquioxane-co-cyclohexylsilsesquioxane) (PHMB/CHS); poly(p-hydroxy-α-methylbenzylsilsesquioxane-co-phenylsilsesquioxane) (PHMB/PS); poly(p-hydroxy-α-methylbenzylsilsesquioxane-co-bicycloheptylsilsesquioxane) (PHMB/BHS); and poly(p-hydroxybenzylsilsesquioxane-co-phydroxyphenylethylsilsesquioxane) (PHB/HPES).

The amphiphilic molecules are incorporated on and/or into a porous carrier to form a composite that facilitates the film forming process. The composite may be stored in an air tight or otherwise protected container. The porous carrier may function and/or look like a sponge.

In order to facilitate loading the porous carrier with the amphiphilic molecules, the amphiphilic molecules may be optionally combined with a solvent. Either the mixture of solvent and amphiphilic molecules or the amphiphilic molecules (without solvent) is then contacted with the porous carrier for a sufficient time to permit the mixture/amphiphilic molecules to infiltrate the pores. In this connection, the porous carrier may be dipped in the mixture/amphiphilic molecules or the mixture/amphiphilic molecules may be sprayed or poured on the porous carrier. Alternatively, the amphiphilic molecules may be melted and contacted with the porous carrier, the amphiphilic molecules may be combined with a solvent, then contacted the porous carrier, or the amphiphilic molecules may be injected in the porous carrier using a syringe. Regardless of how the amphiphilic molecules are incorporated into the porous carrier, it is desirable that the amphiphilic molecules are substantially uniformly distributed throughout the porous carrier.

Solvents to which the amphiphilic molecules may be combined are generally non-polar organic solvents. Such solvents typically include alcohols such as isopropanol; alkanes such as cyclohexane, and methyl cyclohexane; aromatics such as toluene, trifluorotoluene; alkylhaolsilanes, alkyl or fluoralkyl substituted cyclohexanes; ethers; perfluorinated liquids such as perfluorohexanes; and other hydrocarbon containing liquids. Examples of perfluorinated liquids include those under the trade designation Fluorinert™ and Noveck™ available from 3M. When combining the amphiphilic molecules with one or more solvents, heat may be optionally applied to facilitate formation of a uniform mixture.

A film forming catalyst and/or a quencher may be combined with the amphiphilic material or mixture of amphiphilic material and solvent to facilitate the film formation process. Film forming catalysts include metal chlorides such as zinc chloride and aluminum chloride, and mineral acids while quenchers include zinc powders and amines. Each is present in the amphiphilic material or mixture of amphiphilic material and solvent in an amount from about 0.01% to about 1% by weight.

The porous carrier impregnated with the mixture of amphiphilic material and solvent is treated to remove the solvent or substantially all of the solvent by any suitable means. For example, evaporation or vacuum distillation may be employed. After solvent is removed, or in the event the porous carrier is impregnated with amphiphilic material without the use of solvent, heat is applied until a constant weight is achieved. In this instance, heating at a temperature from about 40 to about 100° C. is useful. In most instances, the amphiphilic material solidifies, becomes semi-solid, or becomes a low viscosity liquid and is retained in the pores of the porous carrier.

The porous carrier may be made of any material inert to the amphiphilic molecules, such as metals, metal oxides, and ceramics. When a metal is employed as the porous carrier material, the porous carrier may be referred to as a metal sponge. Examples of materials that may form the porous carrier include one or more of alumina, aluminum silicate, aluminum, brass, bronze, chromium, copper, gold, iron, magnesium, nickel, palladium, platinum, silicon carbide, silver, stainless steel, tin, titanium, tungsten, zinc, zirconium, Hastelloy®, Kovar®, Invar, Monel®, Inconel®, and various other alloys.

Figure 1:
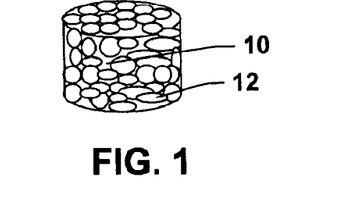
FIG. 1 is an illustration of a composite for forming thin films in accordance with one aspect of the present invention.
Figure 2:
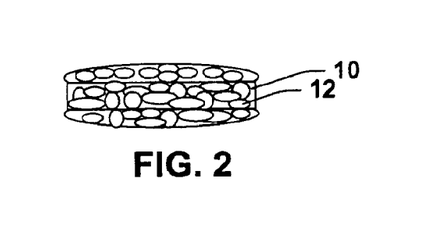
FIG. 2 is an illustration of a composite for forming thin films in accordance with another aspect of the present invention.
Figure 3:
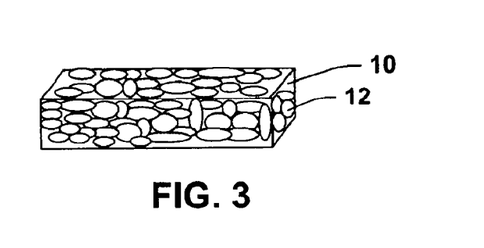
FIG. 3 is an illustration of a composite for forming thin films in accordance with yet another aspect of the present invention.

Such materials in powder, granuole, and/or fiber form are compressed to provide the porous carrier, or compressed and sintered. Any resultant shape may be employed. Shapes of the compressed porous carrier materials include cylindrical, spherical, oval, tablet, disc, plugs, pellets, cubes, rectangles, conical, of any size consistent with a particular application. Referring to FIGS. 1 to 3, various shapes/sizes of a porous carrier are illustrated. In each figure, a porous material 10 contains pores 12 which holds the amphiphilic molecules.

In one embodiment, the porous carrier contains pores having an average pore size from about 1 micron to about 1,000 microns. In another embodiment, the porous carrier contains pores having an average pore size from about 5 microns to about 500 microns. In yet another embodiment, the porous carrier contains pores having an average pore size from about 10 microns to about 200 microns. In still yet another embodiment, the porous carrier contains pores having an average pore size from about 20 microns to about 100 microns. The size of the pores may be controlled by adjusting the size of the particulates initially compressed together.

Examples of porous carriers include those under the trade designation Mott Porous Metal, available from Mott Corporation; those under the trade designation Kellundite available from Filtros Ltd.; and those under the trade designations Metal Foam, Porous Metal Media and Sinterflo®, available from Provair Advanced Materials Inc.

In one embodiment, the porous carrier has a porosity so that it can absorb from about 0.001 g to about 5 g of amphiphilic material per $cm^3$ of porous carrier. In another embodiment, the porous carrier has a porosity so that it can absorb from about 0.01 g to about 2 g of amphiphilic material per $cm^3$ of porous carrier. In yet another embodiment, the porous carrier has a porosity so that it can absorb from about 0.05 g to about 1 g of amphiphilic material per $cm^3$ of porous carrier. In one embodiment in these porosity amounts, the amphiphilic material includes the amphiphilic molecules and solvent. In another embodiment in these porosity amounts, the amphiphilic material includes the amphiphilic molecules without solvent.

The methods and composites of the present invention are advantageous for providing thin films on substrates. Substrates include those with porous and non-porous surfaces such as glasses, glass having an antireflection coating such as magnesium fluoride, silica (other metal oxides), germanium oxide, ceramics, porcelains, fiberglass, metals, and organic materials including thermosets such as polycarbonate, and thermoplastics. Additional organic materials include polystyrene and its mixed polymers, polyolefins, in particular polyethylene and polypropylene, polyacrylic compounds, polyvinyl compounds, for example polyvinyl chloride and polyvinyl acetate, polyesters and rubber, and also filaments made of viscose and cellulose ethers, cellulose esters, polyamides, polyurethanes, polyesters, for example polyglycol terephthalates, and polyacrylonitrile.

Glasses specifically include lenses, such as eyewear lenses, microscope slides, binocular lenses, microscope lenses, telescope lenses, camera lenses, video lenses, televison screens, computer screens, LCDs, mirrors, prisms, and the like. Substrates may have a primer layer of a material desired to improve adhesion between the substrate surface and the amphiphilic molecules.

Employing the porous carrier of the present invention, the amphiphilic molecules are applied as a thin film to a substrate surface using any suitable thin film forming technique. The porous carrier contributes to the efficient delivery of amphiphilic molecules to the substrate surface, while minimizing or eliminating damage to the substrate and minimizing waste of the amphiphilic molecules.

Film forming techniques involve exposing the substrate to the amphiphilic molecules incorporated on the porous carrier in a chamber or closed environment under at least one of reduced pressure, elevated temperature, irradiation, and power. Preferably, reduced pressure and/or elevated temperatures are employed. The reduced pressure, elevated temperatures, irradiation, and/or power imposed induce vaporization or sublimation of the amphiphilic molecules into the chamber atmosphere and subsequent self assembly and/or self-polymerization on the substrate surface in a uniform and continuous fashion thereby forming the thin film.

In one embodiment, the substrate is exposed to the amphiphilic molecules under a pressure from about 0.000001 to about 760 torr. In another embodiment, the substrate is exposed to the amphiphilic molecules under a pressure from about 0.00001 to about 200 torr. In yet another embodiment, the substrate is exposed to the amphiphilic molecules under a pressure from about 0.0001 to about 100 torr.

In one embodiment, the composite/porous carrier is heated to a temperature from about 20 to about 400° C. In another embodiment, the composite/porous carrier is heated to a temperature from about 40 to about 350° C. In yet another embodiment, the composite/porous carrier is heated to a temperature from about 50 to about 300° C. Only the composite/porous carrier needs to be at the temperature described above to induce film formation. The substrate is at about the same or at a different temperature as the composite/porous carrier in the chamber. The composite/porous carrier is at about the same or at a different temperature as the atmosphere of the chamber. The substrate is at about the same or at a different temperature as the atmosphere of the chamber. In one embodiment, each of the substrate, composite, and atmosphere is at a temperature from about 20 to about 400° C.

In one embodiment, the amount of amphiphilic material used is from about $1 \times 10^{-3}$ mmole/ft$^3$ to about 10 mmole/ft$^3$ of chamber volume. In another embodiment, the amount of amphiphilic material used is from about $1 \times 10^{-2}$ mmole/ft$^3$ to about 1 mmole/ft$^3$ of chamber volume.

In one embodiment, the substrate and the amphiphilic material remains in contact for a time from about 10 seconds to about 24 hours (under specified temperature and pressure). In another embodiment, the substrate and the amphiphilic material remains in contact for a time from about 30 seconds to about 1 hour. Alternatively, time limitations can be ignored so long as the film thickness is monitored so that the process may be terminated after the desired thickness is achieved.

The film formation rate is primarily dependent upon one or more of the identity of the amphiphilic material, the identity of the porous carrier, and the film formation conditions (temperature, pressure, and the like). In one embodiment, the film formation rate is about 0.01 nm/sec or more and about 1 nm/sec or less (nm in film thickness). In another embodiment, the film formation rate is about 0.05 nm/sec or more and about 0.5 nm/sec or less.

General examples of film forming techniques include vacuum deposition; vacuum coating; box coating; sputter coating; vapor deposition or chemical vapor deposition (CVD) such as low pressure chemical vapor deposition (LPCVD), plasma enhanced chemical vapor deposition (PECVD), high temperature chemical vapor deposition (HTCVD); and sputtering. Such techniques are known in the art and not described for brevity sake.

Vapor deposition/chemical vapor deposition techniques and processes have been widely disclosed in literature, for example: *Thin Solid Films*, 1994, 252, 32–37; *Vacuum technology* by Ruth A. 3$^{rd}$ edition, Elsevier Publication, 1990, 311–319; *Appl. Phys. Lett.* 1992, 60, 1866–1868; *Polymer Preprints,* 1993, 34,427–428; U.S. Pat. Nos. 6,265,026; 6,171,652; 6,051,321; 5,372,851; and 5,084,302, which are hereby incorporated by reference for their teachings in forming films or depositing organic compounds on substrates.

Figure 4:
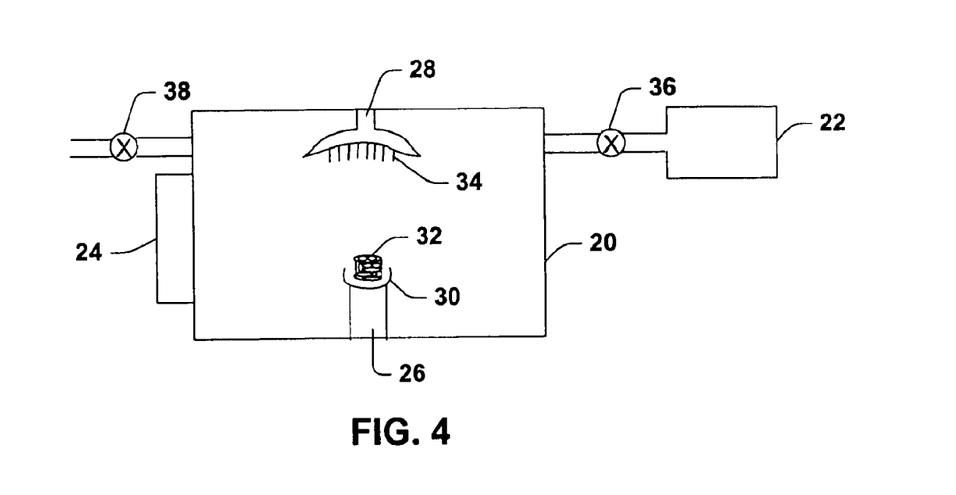
FIG. 4 is a schematic view of a system for forming thin films in accordance with one aspect of the present invention.

Referring to FIG. 4, a method and system for forming thin films is described. Generally speaking, a chamber 20 such as a vacuum chamber is employed for use in the present invention. The chamber may be an insulated rectangular metal box having a door which is sealed by a gasket when closed and allows insertion and removal of items. The box can have an inside chamber that is optionally attached to a high vacuum pump 22 capable of drawing a vacuum of, for example, 0.0001 torr. Examples of chambers include those under the trade designation Satis, such as MC LAB 260, MC LAB 360, 900 DLS, 1200 TLS, and 150 available from Sats Vacuum AG; those under the trade designation Univex, such as 300, 350, and 400 available from Leybold Vacuum; those under the trade designation Integrity® 36, 39, 44, and 50 available from Denton Vacuum; and those under the trade designation Balinit® available from Balzers.

The chamber can be equipped with separate heating devices for at least one of heating the chamber 24, heating/vaporizing the amphiphilic material 26 and heating the substrates 28. A number of different devices such as resistance electrodes, a resistance heater, an induction coil, or an electron or laser beam can be used for rapidly heating the amphiphilic materials to a high temperature for vaporization. An electric heater block may be used for this purpose. The heater may heat a crucible 30 in which the composite 32 is placed.

The substrates 34 to be coated with a thin, hydrophobic film in accordance with the invention are placed inside the chamber, in any suitable position. The composite 32 of a porous carrier and amphiphilic material is also placed in contact with a heating device 26 inside the chamber 20 and the door is closed. Although a cone arrangement is shown, the composite 32 of a porous carrier and amphiphilic material and substrates 34 may be positioned in any manner. A strong vacuum from about $2 \times 10^{+2}$ to about $5 \times 10^{-4}$ torr is optionally applied to the chamber 20. A valve 36 connecting the pump 22 to the chamber 20 is closed to keep the chamber 20 at constant high vacuum. The amphiphilic material is heated quickly to vaporize the material. The gas phase amphiphilic molecules spread uniformly and very quickly throughout the chamber 20. As the amphiphilic molecules vaporize, the vacuum inside the chamber may rise slightly but remains within the range from about $2 \times 10^{+2}$ to about $5 \times 10^{-4}$ torr. The chamber 20 is kept in this condition for a time from about 10 seconds to about 60 minutes or the thickness is monitored by a quartz crystal that can be mounted in the chamber (to obtain a desired thickness). During this time the amphiphilic molecules self-assemble and attach themselves to the surface of the substrates 34 and form a continuous, uniform thin film. The substrate 34 may be rotated to promote uniform application of the amphiphilic material over the substrates 34.

After the selected time, the vacuum pump valve 36 is opened to evacuate the excess gas phase amphiphilic material from the chamber 20. A cold trap or condenser may be optionally employed between the chamber and the pump to condense and trap the excess amphiphilic material vapor so that it does not escape to the atmosphere. Clean air is let into the chamber 20 through another valve 38 thereby bringing it up to atmospheric pressure and the chamber 20 is opened to remove the coated substrates 34.

The film forming composition may be characterized by FTIR and/or NMR using known methods in the art. Other chemical properties such as % of hydroxyl groups may be determined by methods known in the art such as U.S. Pat. No. 4,745,169. Still other physical properties and spectroscopic characterization methods may be employed and are known in the art.

The amphiphilic material and/or film formed therefrom has reactive hydroxyl groups, which become involved in chemical bonding (hydrogen and/or covalent) to the substrate. As the substrate surface reacts with moisture (airborne water molecules), making covalent bonds to the surface, similar to self-assembley of layers, thus providing permanent transparent uniform thin film, which is resistant to many drastic conditions; that is, retaining its excellent hydrophobic/oleophobic properties.

The film provides several advantages on these surfaces including scratch resistance, protection of anti-reflective coatings on eyewear lenses, protect surfaces from corrosion, moisture barrier, friction reduction, anti-static, stain resistance, fringerprint resistance, and the like. The film is typically hydrophobic in nature.

The thin film formed on the substrate using the composite of a porous carrier impregnated with the amphiphilic molecules has a uniform thickness over the substrate. In one embodiment, the thickness of the resultant thin film is from about 1 nm to about 250 nm. In another embodiment, the thickness of the resultant thin film is from about 2 nm to about 200 nm. In yet another embodiment, the thickness of the resultant thin film is from about 5 nm to about 100 nm. In still yet another embodiment, the thickness of the resultant thin film is from about 8 nm to about 20 nm. The thickness of the thin film may be controlled by adjusting the deposition parameters, for example, the length of time the substrate and the composite remain in the chamber under at least of reduced pressure, elevated temperature, irradiation, and/or power.

In one embodiment, the thin film is relatively uniform in that, assuming the substrate has a planar surface, the thickness of the thin film does not vary by more than about 25 nm over the surface of the planar portion of the substrate. In another embodiment, the thin film is relatively uniform in that the thickness of the thin film does not vary by more than about 15 nm over the surface of the planar portion of the substrate.

The thin film formed on the substrate using the composite of a porous carrier impregnated with the amphiphilic molecules is continuous in nature. In other words, pinholes and other film defects in thin films made in accordance with the present invention are minimized and/or eliminated.

In one embodiment, when using a POSS polymer as the amphiphilic material and a glass as the substrate, formation of a layer of silica (or other metal oxide) and amphiphilic material thin film may be conducted in a single chamber. This is because it is not necessary to expose the silica layer to water vapor when forming POSS polymer amphiphilic material layer thereover. Moreover, the formation of any POSS polymer amphiphilic material layer on the interior of the chamber is not harmful, and does not prevent subsequent and repeated use of the chamber for the aforementioned two step process.

The following examples illustrate the present invention. Unless otherwise indicated in the following examples and elsewhere in the specification and claims, all parts and percentages are by weight, all temperatures are in degrees Centigrade, and pressure is at or near atmospheric pressure.

EXAMPLE 1

Three liters of distilled water is placed in a 5 l beaker. The beaker is then chilled to about 5° C. and the temperature is maintained by circulation through a chiller to maintain the temperature, however any method known in the art for maintaining temperature, such as adding ice may be employed. Octadecyltrichlorosilane (300 g) is added dropwise while stirring and maintaining the temperature. The solution is then hydrolyzed to yield a fine crystalline material. The reaction mixture is further stirred for approximately 30 minutes while continuing to maintain temperature. The reaction mixture is then allowed to return to room temperature while being stirred. After returning to room temperature, the reaction mixture is stirred for approximately 10 hours. The reaction mixture is then filtered and washed with water to remove all acid, and then dried. While the mixture is air dried and then oven dried at 95° C. for 2 hours, other methods of drying as are known in the art may alternatively be utilized. After drying the mixture, a white powder having a melting point of 70–72° C. is provided.

EXAMPLE 2

The procedure of Example 1 is repeated except that heptadecafluoro-1,1,2,2-tetrahydrodecyl trichlorosilane is used in place of octadecyltrichlorosilane. After drying the mixture, a white powder having a melting point of 67° C. is provided.

EXAMPLE 3

The procedure of Example 1 is repeated except that octyl trichlorosilane is used in place of octadecyltrichlorosilane. After drying the mixture, a very thick clear oil is provided.

EXAMPLE 4

Hexadecyl trimethoxysilane (25 g), 15 ml of distilled water, 40 ml of 2-propanol and 2 ml of concentrated HCl are stirred in a 250 ml flask. The mixture becames a white thick precipitate in a few minutes and becomes difficult to stir. An additional 100 ml of a 50:50 water-2 propanol mixture is added and the reaction mixture is stirred at room temperature for 10 hours and later heated to 70° C. for 2 hours to fully hydrolyze and yield a fine powder. Isolation and filtration are carried out as per Example 1. The reaction mixture is then dried in an oven at 98° C. for 2 hours. The mixture becames oily and solidified on standing at room temperature, and yielded a white, waxy solid, having a melting point of 65° C.

EXAMPLE 5

The procedure of Example 4 is repeated except that a 1:1 molar ratio of tridecafluorooctyl triethoxysilane and hexadecyl trimethoxysilane is used in place of hexadecyl trimethoxysilane. A semi-solid is provided.

EXAMPLE 6

Tridecafluorooctyl triethoxysilane and hexadecyl trimethoxysilane having varying weight ratios are mixed together. In addition, tetraethoxysilane is added so as to comprise about 5% to about 10% of total weight of the mixture. The mixture is then and hydrolyzed under the experimental conditions of Examples 4 and 5, however zinc 2-ethylhexoate (zinc octoate) is added as catalyst for cross-linking agent to the hydrolyzed tetraethoxysilane to increase the number of reactive sites. Alcohol and water are removed using a rotavap at reduced pressure. The mixture yielded a white paste semi-solid.

While the invention has been explained in relation to certain embodiments, it is to be understood that various modifications thereof will become apparent to those skilled in the art upon reading the specification. Therefore, it is to be understood that the invention disclosed herein is intended to cover such modifications as fall within the scope of the appended claims.

What is claimed is:

1. A method of forming a thin film on a substrate, comprising:

providing the substrate in a chamber;

forming an oxide coating on the substrate in the chamber;

inserting a composite comprising a porous carrier and a polyhedral oligomeric silsesquioxane amphiphilic material into the chamber, wherein the porous carrier comprises a metal and comprises pores having an average pore size from about 1 micron to about 1,000 microns;

in the chamber, setting at least one of a temperature of the composite from about 20 to about 400° C. and a pressure from about 0.000001 to about 760 torr to induce vaporization of the polyhedral oligomeric silsesquioxane amphiphilic material; and recovering the substrate having the thin film thereon.

2. The method of claim 1, wherein the polyhedral oligomeric silsesquioxane amphiphilic material comprises at least one selected from the group consisting of poly(p-hydroxybenzylsilsesquioxane); poly(p-hydroxybenzylsilsesquioxane-co-methoxybenzylsilsesquioxane); poly(p-hydroxybenzylsilsesquioxane-co-t-butylsilsesquioxane); poly(p-hydroxybenzylsilsesquioxane-co-cyclohexylsilsesquioxane); poly(p-hydroxybenzylsilsesquioxane-co-phenylsilsesquioxane); poly(p-hydroxybenzylsilsesquioxane-co-bicycloheptylsilsesquioxane); poly(p-hydroxyphenylethylsilsesquioxane); poly(p-hydroxyphenylethylsilsesquioxane-co-phydroxy-α-methylbenzyls ilsesquioxane); poly(p-hydroxyphenylethylsilsesquioxane-co-methoxybenzylsilsesquioxane); poly(p-hydroxyphenylethylsilsesquioxane-co-t-butylsilsesquioxane); poly(p-hydroxyphenylethylsilsesquioxane-co-cyclohexylsilsesquioxane); poly(p-hydroxyphenylethylsilsesquioxane-co-phenylsilsesquioxane); poly(p-hydroxyphenylethylsilsesquioxane-co-bicycloheptylsilsesquioxane); poly(p-hydroxy-α-methylbenzylsilsesquioxane); poly(p-hydroxy-α-methylbenzylsilsesquioxane-co-p-hydroxybenzylsilsesquioxane); poly(p-hydroxy-α-methylbenzylsilsesquioxane-co-methoxybenzylsilsesquioxane); poly(p-hydroxy-α-methylbenzylsilsesquioxane-co-t-butylsilsesquioxane); poly(p-hydroxy-α-methylbenzylsilsesquioxane-co-cyclohexylsilsesquioxane); poly(p-hydroxy-α-methylbenzylsilsesquioxane-co-phenylsilsesquioxane); poly(p-hydroxy-α-methylbenzylsilsesquioxane-co-bicycloheptylsilsesquioxane); and poly(p-hydroxybenzylsilsesquioxane-co-p-hydroxyphenylethylsilsesquioxane).

3. The method of claim 1, wherein the thin film is formed at a rate from about 0.05 nm/sec to about 0.5 nm/sec or less.

4. The method of claim 1, wherein the metal comprises at least one selected from the group consisting of aluminum, brass, bronze, chromium, copper, gold, iron, nickel, palladium, platinum, silver, stainless steel, tin, titanium, tungsten, zinc, and zirconium.

5. The method of claim 1, wherein the composite further comprises at least one of a non-polar organic solvent, a film forming catalyst, and a quencher.

6. The method of claim 1, wherein the substrate comprises at least one of a glass, a glass having an antireflection coating thereon, silica, germanium oxide, a ceramic, porcelain, fiberglass, a metal, a thermoset, and a thermoplastic.

7. The method of claim 1, wherein the porous carrier comprises pores having an average pore size from about 5 microns to about 500 microns.

8. The method of claim 1, wherein the porous carrier has a porosity so that it absorbs from about 0.001 g to about 5 g of polyhedral oligomeric silsesquioxane amphiphilic material per $cm^3$ of porous carrier.

9. The method of claim 1, wherein after setting at least one of the temperature and the pressure, keeping the substrate in the chamber for a time from about 10 seconds to about 24 hours.

10. The method of claim 1, wherein the pressure is set prior to setting the temperature.

11. The method of claim 1, wherein the temperature is set from about 40 to about 350° C. and the pressure is set from about 0.00001 to about 200 torr.

12. The method of claim 1, wherein the thin film has a thickness from about 1 nm to about 250 nm.

13. The method of claim 1, wherein the polyhedral oligomeric silsesquioxane amphiphilic material comprises reactive hydroxyl groups.

14. A method of forming a thin film on a substrate, comprising:

providing the substrate in a chamber;

forming an oxide coating on the substrate in the chamber;

inserting a composite comprising a porous carrier and a polyhedral oligomeric silsesquioxane amphiphilic material into the chamber, wherein the porous carrier comprises at least one metal selected from the group consisting of aluminum, brass, bronze, chromium, gold, iron, nickel, palladium, platinum, silver, stainless steel, tin, titanium, tungsten, zinc, and zirconium and the porous carrier comprises pores having an average pore size from about 1 micron to about 1,000 microns;

in the chamber, setting at least one of a temperature of the composite from about 20 to about 400° C. and a pressure from about 0.000001 to about 760 torr to induce vaporization of the POSS amphiphilic material; and recovering the substrate having the thin film thereon.

15. The method of claim 14, wherein the thin film is formed at a rate from about 0.01 nm/sec to about 1 nm/sec.

16. The method of claim 14, wherein the substrate comprises at least one of a glass, a glass having an antireflection coating thereon, silica, germanium oxide, a ceramic, porcelain, fiberglass, a metal, a thermoset, and a thermoplastic.

17. The method of claim 14, wherein the porous carrier comprises pores having an average pore size from about 5 microns to about 500 microns.

18. The method of claim 14, wherein the porous carrier has a porosity so that it absorbs from about 0.001 g to about 5 g of polyhedral oligomeric silsesquioxane amphiphilic material per cm$^3$ of porous carrier.

19. The method of claim 14, wherein after setting at least one of the temperature and the pressure, keeping the substrate in the chamber for a time from about 10 seconds to about 24 hours.

20. The method of claim 14, wherein the pressure is set prior to setting the temperature.

21. The method of claim 14, wherein the temperature is set from about 40 to about 350° C. and the pressure is set from about 0.00001 to about 200 torr.

22. The method of claim 14, wherein the thin film has a thickness from about 1 nm to about 250 nm.

23. The method of claim 14, wherein the polyhedral oligomeric silsesquioxane amphiphilic material comprises at least one selected from the group consisting of poly(p-hydroxybenzylsilsesquioxane); poly(p-hydroxybenzylsilsesquioxane-co-methoxybenzylsilsesquioxane); poly(p-hydroxybenzylsilsesquioxane-co-t-butylsilsesquioxane); poly(p-hydroxybenzylsilsesquioxane-co-cyclohexylsilsesquioxane); poly(p-hydroxybenzylsilsesquioxane-co-phenylsilsesquioxane); poly(p-hydroxybenzylsilsesquioxane-co-bicycloheptylsilsesquioxane); poly(p-hydroxyphenylethylsilsesquioxane); poly(p-hydroxyphenylethylsilsesquioxane-co-p-hydroxy-α-methylbenzylsilsesquioxane); poly(p-hydroxyphenylethylsilsesquioxane-co-methoxybenzylsilsesquioxane); poly(p-hydroxyphenylethylsilsesquioxane-co-t-butylsilsesquioxane); poly(p-hydroxyphenylethylsilsesquioxane-co-cyclohexylsilsesquioxane); poly(p-hydroxyphenylethylsilsesquioxane-co-phenylsilsesquioxane); poly(p-hydroxyphenylethylsilsesquioxane-co-bicycloheptylsilsesquioxane); poly(p-hydroxy-α-methylbenzylsilsesquioxane); poly(p-hydroxy-α-methylbenzylsilsesquioxane-co-p-hydroxybenzylsilsesquioxane); poly(p-hydroxy-α-methylbenzylsilsesquioxane-co-methoxybenzylsilsesquioxane); poly(p-hydroxy-α-methylbenzylsilsesquioxane-co-t-butylsilsesquioxane); poly(p-hydroxy-α-methylbenzylsilsesquioxane-co-cyclohexylsilsesquioxane); poly(p-hydroxy-α-methylbenzylsilsesquioxane-co-phenylsilsesquioxane); poly(p-hydroxy-α-methylbenzylsilsesquioxane-co-bicycloheptylsilsesquioxane); and poly(p-hydroxybenzylsilsesquioxane-co-p-hydroxyphenylethylsilsesquioxane).

* * * * *